United States Patent
Abedifard et al.

(10) Patent No.: US 9,911,482 B2
(45) Date of Patent: Mar. 6, 2018

(54) METHOD AND APPARATUS FOR ADJUSTMENT OF CURRENT THROUGH A MAGNETORESISTIVE TUNNEL JUNCTION (MTJ) BASED ON TEMPERATURE FLUCTUATIONS

(71) Applicant: Avalanche Technology, Inc., Fremont, CA (US)

(72) Inventors: Ebrahim Abedifard, San Jose, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/434,966

(22) Filed: Feb. 16, 2017

(65) Prior Publication Data

US 2017/0162242 A1 Jun. 8, 2017

Related U.S. Application Data

(63) Continuation of application No. 14/824,982, filed on Aug. 12, 2015, now Pat. No. 9,607,676.

(51) Int. Cl.
*G11C 11/16* (2006.01)

(52) U.S. Cl.
CPC ...... *G11C 11/1675* (2013.01); *G11C 11/1697* (2013.01)

(58) Field of Classification Search
CPC .............. G11C 11/16; G11C 11/1675
USPC ................................ 365/158, 173
See application file for complete search history.

(56) References Cited

U.S. PATENT DOCUMENTS

| | | | | | |
|---|---|---|---|---|---|
| 5,589,777 | A | * | 12/1996 | Davis | G01R 31/02 324/210 |
| 5,619,430 | A | * | 4/1997 | Nolan | G05D 23/1917 320/150 |
| 6,661,724 | B1 | * | 12/2003 | Snyder | G11C 7/04 365/185.28 |
| 6,977,838 | B1 | * | 12/2005 | Tsang | G11C 5/145 365/158 |
| 7,755,965 | B2 | | 7/2010 | Chen et al. | |
| 2001/0047494 | A1 | * | 11/2001 | Thomas | G06F 1/206 713/503 |
| 2005/0157541 | A1 | | 7/2005 | Iwata | |
| 2007/0133329 | A1 | * | 6/2007 | Braun | G11C 7/04 365/212 |
| 2009/0323400 | A1 | * | 12/2009 | Shinozaki | G11C 11/413 365/154 |

(Continued)

*Primary Examiner* — Michael Tran
(74) *Attorney, Agent, or Firm* — Maryam Imam; Bing K. Yen

(57) ABSTRACT

A non-volatile memory system includes a first circuit and a second circuit both coupled to a magnetoresistance tunnel junction (MTJ) cell to substantially reduce the level of current flowing through the MTJ with rise in temperature, as experienced by the MTJ. The first circuit is operable to adjust a slope of a curve representing current as a function of temperature and the second circuit is operable to adjust a value of the current level through the MTJ to maintain current constant or to reduce current when the temperature increases. This way sufficient current is provided for the MTJ at different temperatures to prevent write failure, over programming, MTJ damage and waste of current.

8 Claims, 4 Drawing Sheets

(56) References Cited

U.S. PATENT DOCUMENTS

| | | | |
|---|---|---|---|
| 2010/0091562 A1* | 4/2010 | Chen | G11C 7/04 365/171 |
| 2011/0080775 A1* | 4/2011 | Bae | G11C 7/04 365/163 |
| 2012/0305879 A1* | 12/2012 | Lu | H01L 27/101 257/4 |
| 2013/0223173 A1* | 8/2013 | Higashi | G11C 7/00 365/218 |
| 2013/0235689 A1* | 9/2013 | Koyama | G11C 5/14 365/227 |
| 2013/0249392 A1* | 9/2013 | Kim | F21V 29/004 315/34 |
| 2015/0108908 A1* | 4/2015 | Denvir | H05B 33/0815 315/186 |
| 2015/0262639 A1* | 9/2015 | Fujita | G11C 11/1675 365/158 |
| 2016/0179164 A1* | 6/2016 | Park | G06F 1/324 713/322 |

* cited by examiner

METHOD AND APPARATUS FOR ADJUSTMENT OF CURRENT THROUGH A MAGNETORESISTIVE TUNNEL JUNCTION (MTJ) BASED ON TEMPERATURE FLUCTUATIONS

CROSS-REFERENCE TO RELATED APPLICATIONS

The present application is a continuation of the commonly assigned application bearing Ser. No. 14/824,982 filed on Aug. 12, 2015 by Abedifard et al. and entitled "METHOD AND APPARATUS FOR ADJUSTMENT OF CURRENT THROUGH A MAGNETORESISTIVE TUNNEL JUNCTION (MTJ) BASED ON TEMPERATURE FLUCTUATIONS," the content of which, including the specification, is incorporated herein by reference in its entirety.

BACKGROUND OF THE INVENTION

Field of the Invention

The invention relates generally to magnetoresistive tunnel junctions (MTJs) and particularly to reliability thereof.

Description of the Prior Art

Magnetoresistive tunnel junctions (MTJs) show future promise in replacing the position today's random access memories (RAMs) enjoy for a number of reasons among which is their considerably smaller size and greater speed. However, challenges remain in producing reliable MTJs, particularly in volumes. Designers and manufacturers struggle with the consistent and reliable programmability and sensing of MTJs. Their small form factor is of no help and rather causes challenges such as providing sufficient voltage and current for proper operability of MTJs yet not exceeding the level of current to the point of causing permanent damage. This may seem like a trivial task but in reality, when working on a very small level, reaching a sweet spot range can be a challenging task in and of itself.

As a fall out of MTJ's programming characteristics, current requirements decrease when temperature rises. When programmed with excessive current, MTJs are placed in danger of being permanently damaged.

There is a phenomenon known as "hopback" that occurs due to intolerable current levels where programming the MTJ to a certain logical state that causes the MTJ to take on a high resistance results in the programming of the MTJ to a state represented by a low resistance instead. Clearly, this outcome is unacceptable. Another outcome of higher-than-necessary current flow through a MTJ is unnecessary power consumption. One way of overcoming the problems associated with an undesirable increase in current at high temperatures is to control the level of current through the MTJ and compensate at different temperatures. But to do so requires the use of a current source that uses considerably higher voltages than that required by MTJ and is therefore impractical.

Thus, there is a need for reliable programming and sensing of MTJs at different temperatures.

SUMMARY OF THE INVENTION

To overcome the limitations in the prior art described above, and to overcome other limitations that will become apparent upon reading and understanding the present specification, the present invention discloses a method and a corresponding structure for a magnetic memory system including magnetic tunnel junctions (MTJs) and structures and methods for programming the same.

Briefly, a non-volatile memory system comprises a first circuit and a second circuit both coupled to a magnetoresistance tunnel junction (MTJ) cell to substantially compensate the level of current flowing through the MTJ over variances in temperature, as experienced by the MTJ. The first circuit is operable to adjust a slope of a curve representing current as a function of temperature and the second circuit is operable to adjust a value of the current level through the MTJ to compensate the current or basically reduce current when temperature increases.

These and other objects and advantages of the present invention will no doubt become apparent to those skilled in the art after having read the following detailed description of the preferred embodiments illustrated in the several figures of the drawing.

IN THE DRAWINGS

DETAILED DESCRIPTION OF VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Current is important for programming the MTJ. A current source provides current despite voltage and seems to be a viable candidate for controlling current through the MTJ but this is actually an impractical approach because a lot of voltage is required to implement a current source.

In accordance with various embodiments and methods of the invention, current is controlled or adjusted to compensate for the rise in temperature so as to prevent hopback and damage to the MTJ.

Figure 1:
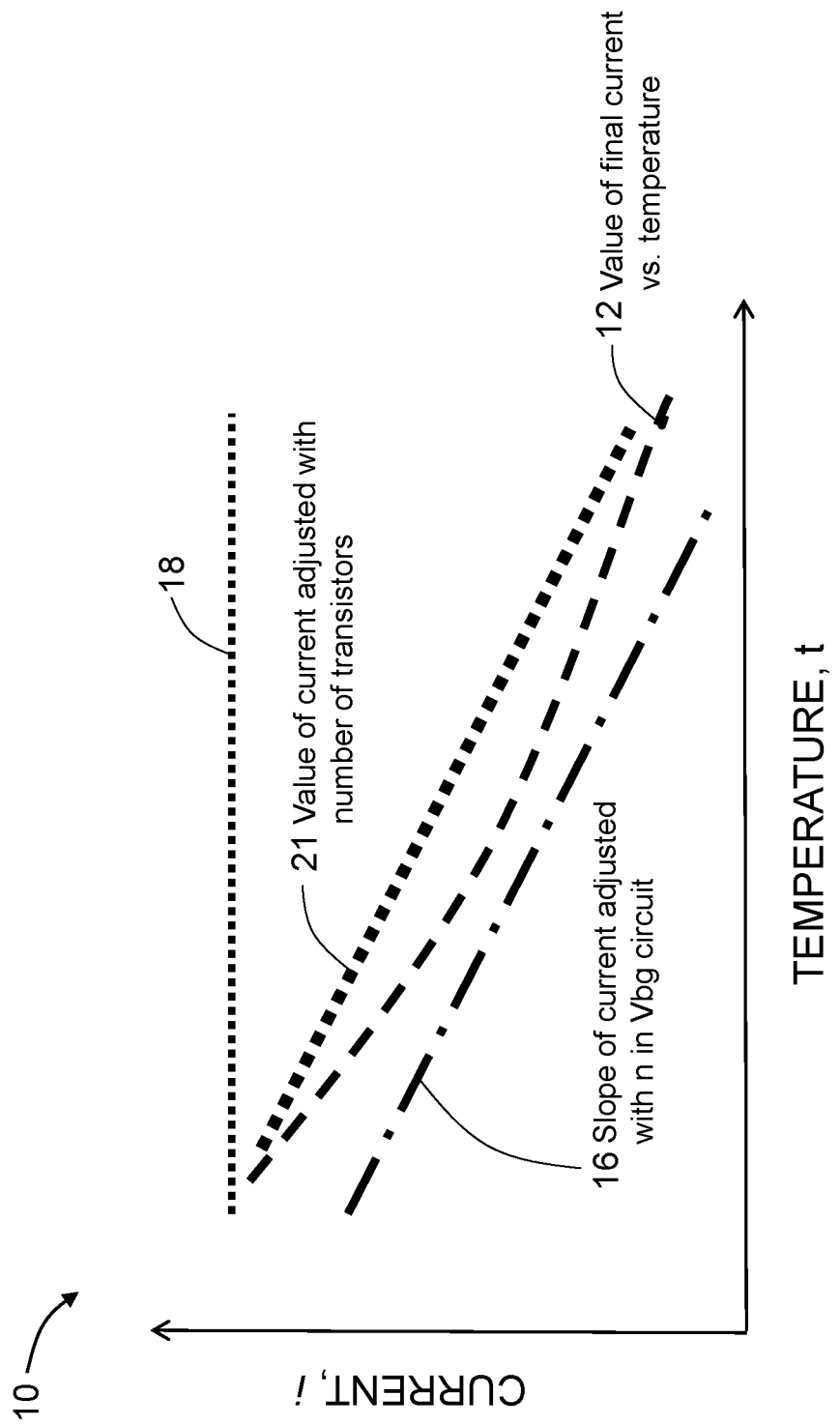
FIG. 1 shows a graph 10 of change in programming current flow, through a magneto-resistive tunnel junction (MTJ), as shown in the y-axis, over the change in temperature experienced by the same MTJ, as shown in the x-axis.

FIG. 1 shows a graph 10 of change in current flow, through a magneto-resistive tunnel junction (MTJ), as shown in the y-axis, over the change in temperature experienced by the same MTJ, as shown in the x-axis. The graph 10 shows four curves in particular, curves 12-18, one of which, i.e. curve 18, represents the relationship between current and temperature of the MTJ under ideal conditions with current remaining constant as temperature increases. Clearly, this ideal condition is unrealistic and impractical.

Rather and in accordance with a method of the invention is providing current for the MTJ that is sufficient for programming it at all temperatures.

In the graph 10, curve 12 shows the behavior of current through the MTJ as temperature of the MTJ increases. A substantial drop in programming current is experienced by the MTJ as it becomes hotter. There are many environments in which a memory system whose memory is made of or includes MTJs and that experiences temperature variations. To name a simple example, oftentimes memories in computers or servers experience a significant increase in temperature due to the operation of the sheer number of components of the computer/server. The curve 12 shows generally, the behavior of MTJs with temperature.

In an ideal world, curve 12 should be precisely tracked but that is not a possibility. To maintain the current flow through a MTJ experiencing a rise in temperature as constant as possible, the inventor has devised methods and embodiments for adjusting the slope as well as the current level through the MTJ.

It is understood that the methods and embodiments of the invention for programming of (or writing to) an MTJ are applicable to practically any type of MTJ and further applicable to any programmable non-volatile and variable resistive memory element.

Curve 14 is intended to show the result of the current level through the MTJ, as temperature increases, where an adjustment to the current level is made using the various embodiments of the invention. Arrows 21, in FIG. 1, are intended to show the change in the curve 12 to the right or left of the curve 12 when current is adjusted per various embodiments of the invention. Note that the slope of the curve 12 remains substantially constant as current is adjusted.

Curve 16 similarly shows current vs. temperature but it is the slope of this curve and not the shift up or down that results when an adjustment is made pursuant to various embodiments of the invention. While not shown in graph 10 for the sake of clarity, the slope of curve 16 changes by adjustment of resistor values of resistors 36 and 38 in FIG. 2 or resistors 304 and 306 in FIG. 3. That is, representing this factor by 'n' in FIG. 2, the slope of curve 16 alters with changes to 'n' as indicated in and discussed relative to the equation below with reference to FIG. 2. 'N' represents R1/(R2−R1) where R1 and R2 each represent a resistance value. As will be further discussed below, when a reference voltage, Vref, changes by factor 'n', current also changes by a factor of 'n'.

The following circuits, among a slew of others too numerous to list here, adjust the current level of current flowing through the MTJ thereby shifting of the current-to-temperature curve up and down while adjusting Vref by a factor of 'n' thereby causing the slope of the current-to-temperature curve to change, all in an attempt to bring the curve as close to the curve 18 as possible.

Figure 2:
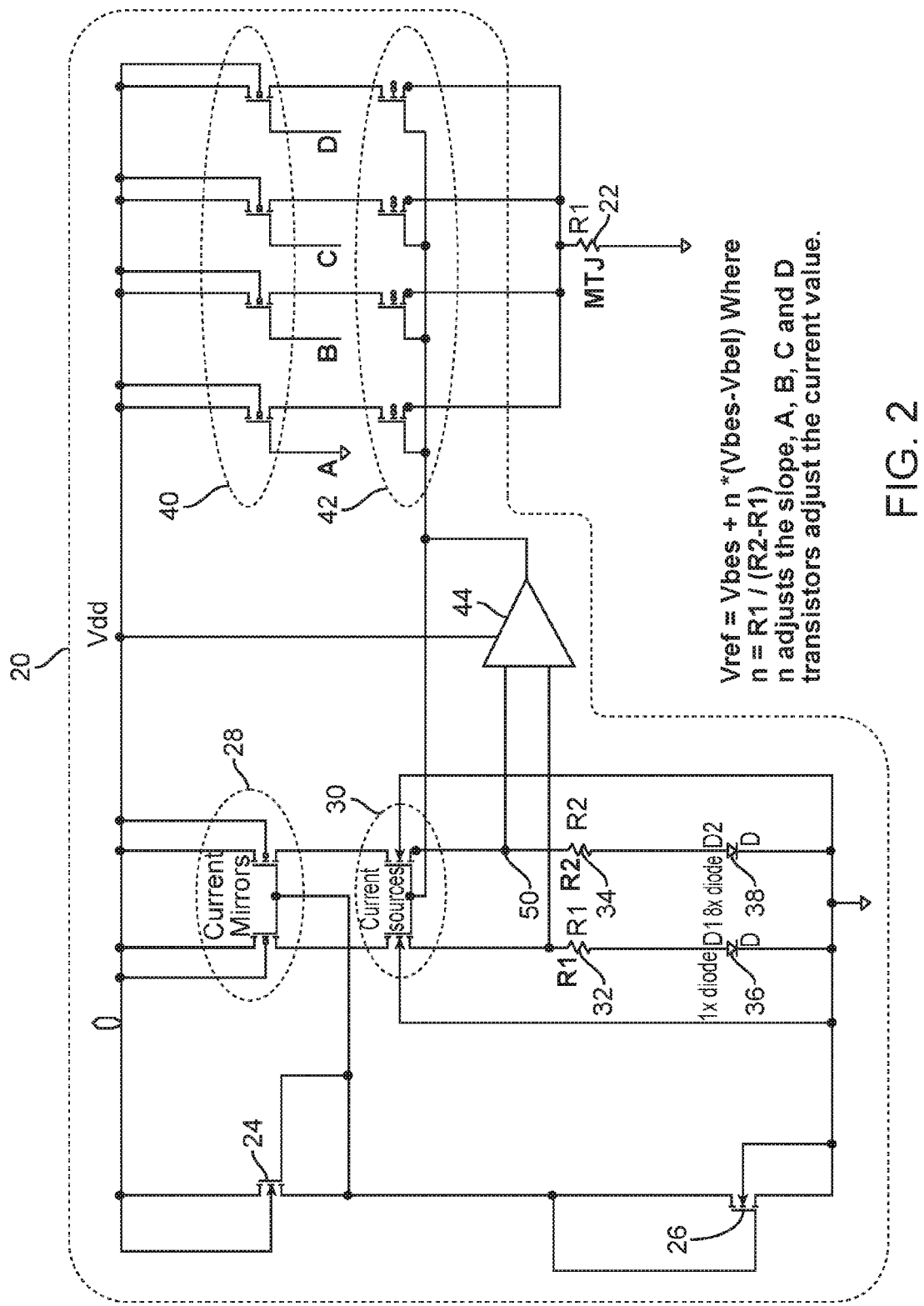
FIG. 2 shows a circuit 20 coupled to the MTJ 22 for controlling the current that flows through the MTJ 22, in accordance with an embodiment of the invention.

FIG. 2 shows a circuit 20 coupled to the MTJ 22 for controlling the current that flows through the MTJ 22, in accordance with an embodiment of the invention. The circuit 20 is shown to include transistors 24 and 26 with the drain of the transistor 24 coupled to Vdd and its gate coupled to the current mirror 28, also a part of the circuit 20. The source of the transistor 24 is shown coupled to the drain of the transistor 26 as well as to its gate therefor making the transistor 24 a current source that sinks current with the same current values as that of the current through the transistors 28. Similarly, the transistor 26's gate and drain are coupled together to provide constant current. The gates of transistors 30, a part of circuit 20, control the level of current flowing through the diodes 36 and 38 by the operation of the amplifier 44.

The circuit 20 is further shown to include resistors (R1) 32 and (R2) 34, along with the diodes 36 and 38, operational amplifier 44, the switch circuit 40 and the current mirrors circuit 42. Each of the circuits 40 and 42 include a series of transistors with gates of each the transistors of the circuit 40 coupled to the source of the corresponding transistor except for one transistor whose gate is grounded. The gates of each of the transistors of the circuit 42 are shown coupled to the current source 30, the drain of each of the transistors of the circuit 42 is shown coupled to the MTJ 22 and each of the sources of the transistors of circuit 42 is shown coupled to a respective transistor of the circuit 40. More particularly, the source of each of the transistors of the circuit 42 is shown coupled to the drain of a respective transistor of the circuit 40. It should be noted that while each of the circuits 40 and 42 is shown to include four transistors, any suitable number of transistors may be employed in each.

Current mirror 28 and the current source 30 are shown coupled together. Current mirror 28 is also shown coupled to Vdd and the current course 30 is shown coupled to the operational amplifier 44 and to the resistors 32 and 34, thus, on the same end, each of the resistors 32 and 34 is coupled to the amplifier 44 while at an opposite end, each of the resistors 32 and 34 is coupled to a respective diode of the diodes 36 and 38. Namely, the resistor 32 is shown coupled to the diode 36 and the resistor 34 is shown coupled to the diode 38. Each of the diodes 36 and 38, at an opposite end, is coupled to ground, as is the source of the transistor 26. It is understood that ground represents a voltage that is substantially zero and Vdd represents a higher voltage than zero and typically the highest voltage supplied to the circuit 20.

The amplifier 44 receives as another input, Vdd, and outputs a reference voltage, Vref, that is coupled to the current source 30 and the circuit 42. Accordingly, the output of the amplifier 44 is coupled to an end of the MTJ 22, through the circuit 42, while an opposite end of the MTJ 22 is coupled to ground.

$$Vref=Vbes+n*(Vbes-Vbel) \qquad \text{Eq. (1)}$$

In Eq. (1), 'Vref' represents the voltage at node 50. 'Vbes' represents the voltage across diode 36 (the smaller diode) and 'Vbel' represents the voltage across diode 38 (the larger diode, in this case times larger than diode 36). 'N' represents R1/(R2−R1). As represented by Eq. (1), 'n' is used to control the slope of the curves shown in FIG. 1.

Diode 34 has a size that is 'n' times the size of diode 32. When temperature across MTJ 22 rises, Vbes decreases but (Vbes−Vbel) increases because in light of the diodes' size difference, the voltage across the diode 36 changes more rapidly than the voltage across the diode 34.

The circuits 40 and 42 generally control the level of the current through MTJ 22 while the remainder of circuit 20 controls the slope of the change in current through the MTJ 22 as a function of changes in temperature experienced by the MTJ 22.

The goal of circuit 20 is to control the current level through the MTJ 22 such that the MTJ 22 is provided with the current level it needs to be operational at all temperatures, i.e. follow the natural characteristics of the MTJ. Accordingly, current mirror circuits 28 and 30 mirror the current through the resistors R1 and R1. The current through the MTJ is adjust to satisfy its current requirements at different temperatures. This combination of R1 and R2 adjusts the slope of the curve 16, for example, to a proper slope to allow for operability of the MTJ 22. The mirrored current from the circuits 28 and 30 is provided as reference current, or reference voltage since voltage and current are factors of each other, to the MTJ 22. Namely, resistances of R1 and R2 define 'n' because n=R1/(R2−R1) and 'n' is multiplied by (Vbes−Vbel), as noted in Eq. (1). Therefore, R1 and R2 effectively determine the slope of the curves 14 and 16 shown in FIG. 1. Resistances R1 and R2 are therefore adjusted until the desired slope, i.e. slope of the curve 12, is approximately reached. R1 and R2 are generally fixed, for example set during manufacturing, and based on the characteristics of the specific MTJ being employed.

In summary, as temperature rises, Vbes drops but (Vbes−Vbel) rises because Vbel drops faster than Vbes. 'N', which is essentially the ratio of resistances R1 and R2, is chosen such that Vref, at node 50, can increase, decrease or stay the same, as desired. Current through the MTJ 22 is controlled by measuring the voltage at a connection between a resistor and a diode, such as the node 50, and detecting a voltage change thereof. The voltage change is based on a change in temperature at the foregoing connection. Upon detecting the voltage change, the voltage at the foregoing connection is digitized and converted to a current, which is used to operate the MTJ 22. Accordingly, during a rise in temperature of the MTJ 22, the current through the MTJ 22 is reduced.

Circuit 42 on the other hand, effectively determines how much the curves 14 and 16 move up and down based on the number of transistors making up the circuit 42 and the size of these transistors. Thus, the number and size of the transistors of circuit 42 are adjusted to the point where the desired current level, i.e. the amount of up and/or down of the curves 14 and 16, is reached. The more transistors in the circuit 42, the higher the variety of currents that can be provided. The current through one of the transistors of circuit 42 is proportional to the current through any of the other transistors of circuit 42. Current that is ultimately supplied to the MTJ 22 is further controlled by the circuit 40.

Circuit 40 functions as a switch to the circuit 42. More specifically, based on the coupling of each of the gates of the transistors of circuit 40, a respective one of the transistors of circuit 42 is turned on or off. In an exemplary embodiment of the invention, coupling of the gate (B) of one of the transistors of the circuit 40 to ground, turns the transistor immediately below it in circuit 42 'on' and coupling of the same gate (B) to Vdd, turns the transistor immediately below it in circuit 42 'off', or vice versa. Each transistor may be independently coupled to ground or Vdd. In this manner, coupling of each transistor of the circuit 40 to ground or Vdd serves to turn on or off the respective transistor.

When turned 'on', the transistors of circuit 42 supply additional current to the MTJ 22. As earlier stated, based on the number of transistors and size thereof, the current supplied to the MTJ 22 is adjusted. Depending on the coupling of each transistor of the circuit 40, a corresponding transistor of the circuit 42 is turned 'on' or 'off'. The more transistors of circuit 42 that are turned 'on', the more current the MTJ 22 is supplied with because turning 'on' a transistor of the circuit 42 causes extra current to flow through to the MTJ 22. When 'off', the MTJ 22 remains unaltered. When some of the transistors are turned on and some are turned off, the level of current applied to the MTJ 22 changes. In this manner, the level of current through the MTJ 22 is adjusted.

In summary, the voltage Vref goes up, stays the same or goes down depending on the value of "n". "n" determines the slope of the curves of FIG. 1. The amount of current flowing through the transistors of circuit 42 follows the n-determinative slope. Current is mirrored to the current through the transistors of circuit 42, which can be and commonly are of varying sizes. For example, the four transistors may be sizes that factors of each other, such as 1×, 2×, 3×, and 4×. The transistors of circuit 40 function as switches turning on and off the transistors of circuit 42. Thus the transistors of circuit 42 determine how much the curve goes up and down. In this manner, with rising temperature, current may be lowered.

Figure 3:
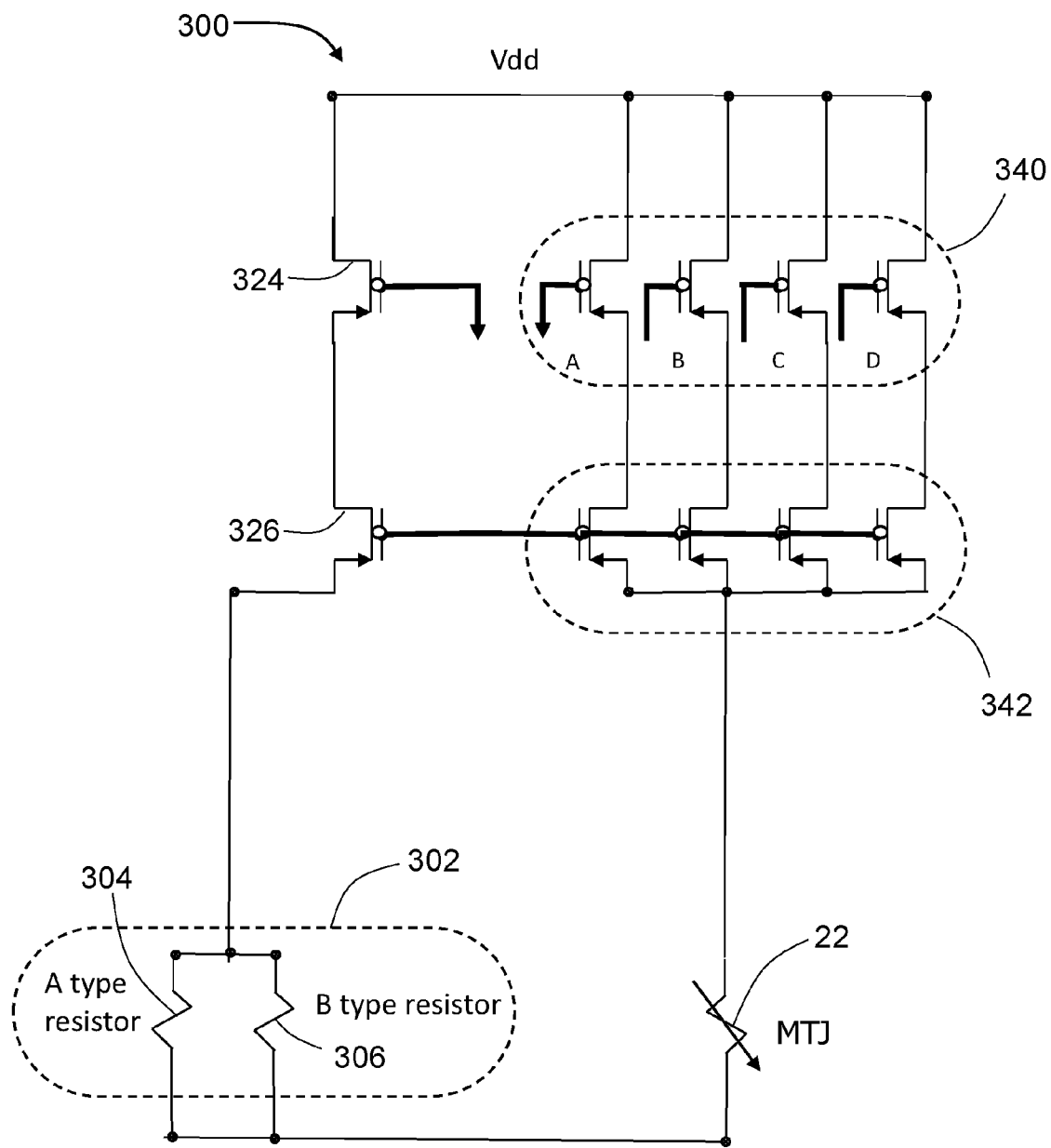
FIG. 3 shows a circuit 300 for adjusting the current flow through a MTJ, in accordance with another embodiment of the invention.

FIG. 3 shows a circuit 300 for adjusting the current flow through a MTJ, in accordance with another embodiment of the invention. The circuit 300 is shown to include a slope-adjustment circuit 302, transistors 326 and 324, which are shown coupled to each other in series, switch circuit 340, and current mirror circuit 342, and the MTJ 22. The circuits 340 and 342 are analogous to the circuits 40 and 42, respectively. The circuit 300 is shown coupled to the MTJ 22.

As in FIG. 3, the transistors of the circuit 340 are coupled together in parallel, similarly, the transistors of the circuit 342 are coupled together in parallel. Circuit 340 is also coupled in parallel with transistor 324, similarly, circuit 340 is coupled in parallel with transistor 326.

The circuit 302 includes two resistors of different type, coupled together in parallel and coupled to the transistor 36 at a common node. At an opposite common node, the circuit 302 is coupled to the MTJ 22. The MTJ 22 is in turn coupled to the circuit 342. The transistors 324 and 326 are coupled together in series.

Using the embodiment of FIG. 3, the slope and value of current through the MTJ 22 is adjusted (shown in graph of FIG. 1) by the circuit 300. The resistors 304 and 306 have varying levels of current flowing through them based on temperature in that the current through one of them increases as a result of rising temperature while the current through the other decreases. A combination of these resistors provides a desirable slope for the curves 14 and 16 of graph 10. Current through the transistors of circuit 342 is proportional to the current through the resistor 326. The transistors of circuit 342 each function as a current mirror. The transistors of circuit 340, A-D, function as switches resulting from the coupling of the transistors' respective gates to substantially ground or Vdd ('on' and 'off').

Analogous to the embodiment of FIG. 2, the circuit 302 determines the slope of the curves shown in FIG. 1 with the goal of the circuit 300 being to mimic the curve 12. Assuming the resistor 304 to be of type A and resistor 306 to be of type B, the slope, i.e. 'n', is determined by the following:

$$Rn = R_A R_B / (R_A + R_B) \quad \text{Eq. (2)}$$

where '$R_A$' is the resistance of resistor 304 and '$R_B$' is the resistance of resistor 306. 'Rn' represents the voltage across MTJ 22/the current flowing through the MTJ 22. Thus, the resistances of the resistors 304 and 306 determine the slope of the curve current vs. temperature for the MTJ 22. The voltage across MTJ 22 accordingly follows the slope of current versus temperature. To move the curve up and down, as in the embodiment of FIG. 2, the circuits 340 and 342 are employed and the discussion above relative to the circuits 40 and 42 apply to these circuits as well. That is, the circuit 340 includes a number of transistors that each acts as a switch to turn 'on' and 'off' each of the transistors of circuit 342 thereby causing a selectable level of current to flow through the MTJ 22. The transistor 326 serves as a current mirror and mirrors the current through the circuit 342, as does the transistor 324 relative to the circuit 340. Accordingly, as the circuit 20 of FIG. 2, circuit 300 of FIG. 3 adjusts the slope and the level of the curve representing current versus temperature of MTJ 22.

Figure 4:
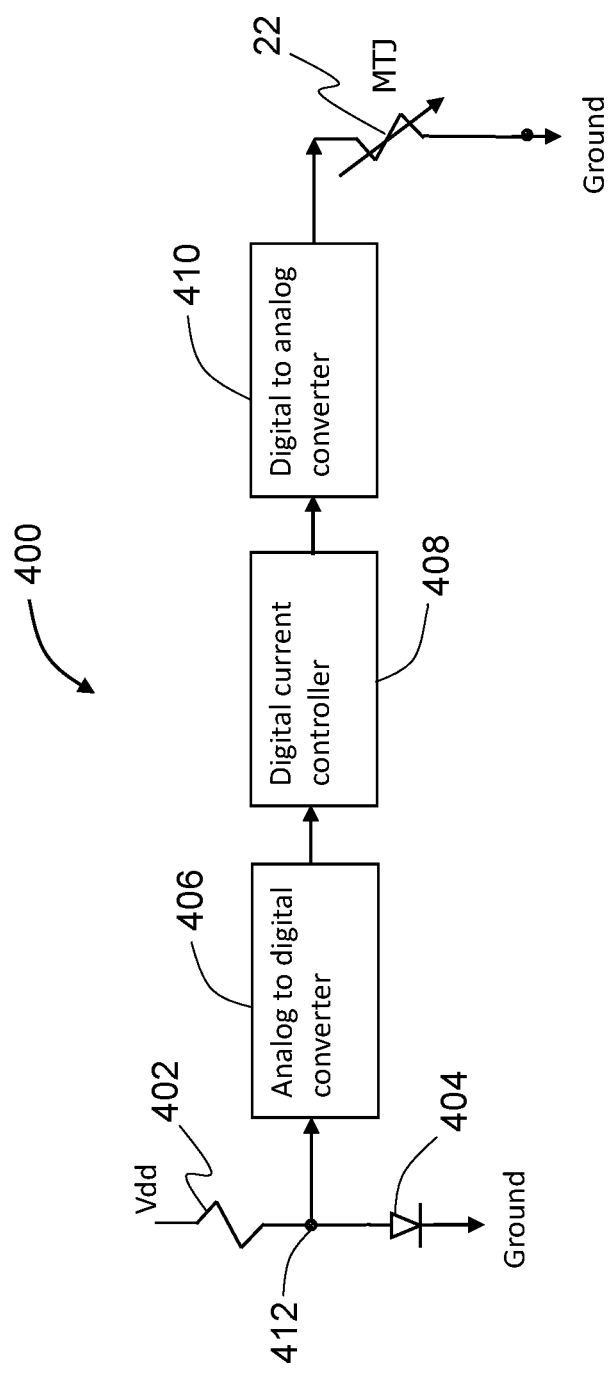
FIG. 4 shows a circuit 400 for adjusting the current flow through a transistor, in accordance with yet another embodiment of the invention.

FIG. 4 shows a circuit 400 for adjusting the current flow through a MTJ, in accordance with yet another embodiment of the invention. The circuit 400 is shown to include the resistor 402, the diode 404, the analog-to-digital converter 406, the digital current controller 408 and the digital-to-analog converter 410. The circuit 400 is shown coupled to the MTJ 22.

The Vbe across the diode 412 drops as temperature increases. This voltage is then converted from analog to digital form by the converter 406 where temperature fluctuations are represented digitally to the controller 408. Temperature is actually represented by a voltage at the node 412 where resistor 402 and diode 404 are coupled. This is because voltage across the diode is a function of temperature. The controller 408 converts the temperature to current values required by the MTJ. The converter 410 then converts the digital representation of current to analog and provides the same to the MTJ 22. Thus, current flowing through the MTJ 22 is controlled by the circuit 400 but what makes the embodiment of circuit 400 different than the embodiments of FIGS. 1 and 2 is that it measures temperature and adjusts the current accordingly. Therefore, a need for adjusting the slope and the up and down of the curves of FIG. 1 are unnecessary. Current through the MTJ 22 is thus controllable and changed according to the sensed temperature, as represented by the voltage at node 412.

In the embodiment of FIG. 4, temperature is monitored on the chip that houses an array of MTJs and used to produce proper current digitally. Temperature monitor generates an analog signal, such as that at node 412. The Vbe across the diode 404 changes with temperature and therefore functions as a temperature sensor. As temperature rises, the current through the diode 404 increases. Based on the change in current-increase through the diode 404, the voltage at node 50 drops. This voltage is digitized and used to adjust current through the MTJ 22.

While a number of embodiments for controlling current as a function of fluctuations in temperature are disclosed herein, it is understood that these are merely exemplary embodiments and others are contemplated.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A circuit comprising:
an MTJ formed on a chip;
a diode circuit located on said chip and operable to measure a temperature of said chip; and
a device coupled to said diode circuit and operable to generate a write current for programming said MTJ according to said temperature,
wherein said write current passes through said MTJ, wherein said device is operable to determine a slope defined by a change in said write current through said MTJ versus a change in said temperature, said device further operable to use said slope to adjust said write current.

2. The circuit of claim 1, wherein said device is a current source controlled by said diode circuit.

3. The circuit of claim 2, wherein said current source is operable to measure a change in a level of said write current and to adjust said write current accordingly.

4. The circuit of claim 1, wherein said device is a current generator.

5. A circuit comprising:
an MTJ formed on a chip;
a temperature-sensitive resistor located on said chip and operable to measure a temperature of said chip; and
a device coupled to said temperature-sensitive resistor and operable to generate a write current for programming said MTJ according to said temperature,
wherein said write current passes through said MTJ, wherein said device is operable to determine a slope defined by a change in said write current through said MTJ versus a change in said temperature, said device further operable to use said slope to adjust said write current.

6. The circuit of claim 5, wherein said device is a current source.

7. The circuit of claim 6, wherein said current source is operable to measure a change in a level of said write current and to adjust said write current accordingly.

8. The circuit of claim 5, wherein said device is a current generator.

* * * * *